US009679507B2

(12) United States Patent
Shin

(10) Patent No.: US 9,679,507 B2
(45) Date of Patent: Jun. 13, 2017

(54) DRIVE INTEGRATED CIRCUIT PACKAGE AND DISPLAY DEVICE INCLUDING THE SAME

(71) Applicant: SAMSUNG DISPLAY CO., LTD., Yongin, Gyeonggi-Do (KR)

(72) Inventor: Byung Hyuk Shin, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 211 days.

(21) Appl. No.: 14/459,124

(22) Filed: Aug. 13, 2014

(65) Prior Publication Data

US 2015/0279258 A1 Oct. 1, 2015

(30) Foreign Application Priority Data

Mar. 26, 2014 (KR) ........................ 10-2014-0035347

(51) Int. Cl.
*G01R 31/26* (2014.01)
*G09G 3/00* (2006.01)

(52) U.S. Cl.
CPC ..... *G09G 3/006* (2013.01); *G09G 2300/0408* (2013.01)

(58) Field of Classification Search
CPC ........ G01R 1/073; G01R 1/30; G01R 31/025; G01R 31/40; G09G 3/006; G09G 3/20; G09G 3/36; G09G 3/3291
See application file for complete search history.

(56) References Cited

U.S. PATENT DOCUMENTS 7,499,677 B2 * 3/2009 Yu ........................ H04L 25/0278 330/253
8,730,228 B2 * 5/2014 Yonemaru .......... H05B 33/0827 345/212
2008/0278280 A1 * 11/2008 Alexeyev ............ H03F 3/45183 340/2.29
2010/0295567 A1 11/2010 Chang

FOREIGN PATENT DOCUMENTS

JP 2004-258131 9/2004
KR 10-2006-0041447 5/2006
KR 10-1222542 1/2013

OTHER PUBLICATIONS

Korean Patent Abstracts Publication No. 10-2008-0001954 A, dated Jan. 4, 2008, for KR 10-1222542, 1 page.

* cited by examiner

*Primary Examiner* — Minh N Tang
(74) *Attorney, Agent, or Firm* — Lewis Roca Rothgerber Christie LLP

(57) ABSTRACT

Provided is a drive integrated circuit package including: bumps configured to be coupled to test pads on a display panel to form coupling portions; a drive integrated circuit including a constant current source configured to provide a constant current to each of the coupling portions; and a voltage measurer configured to measure a voltage difference between terminals of each of the coupling portions.

20 Claims, 11 Drawing Sheets

DRIVE INTEGRATED CIRCUIT PACKAGE AND DISPLAY DEVICE INCLUDING THE SAME

CROSS-REFERENCE TO RELATED APPLICATION

This application claims priority to and the benefit of Korean Patent Application No. 10-2014-0035347 filed on Mar. 26, 2014 in the Korean Intellectual Property Office, the disclosure of which is incorporated herein by reference in its entirety.

BACKGROUND

1. Field

Aspects of embodiments of the present invention relate to a drive integrated circuit package and a display device including the same.

2. Description of the Related Art

Recently, one of the most widely used types of image displays is flat panel displays such as liquid displays (LCDs), plasma display panels (PDPs), and organic light-emitting diode (OLED) displays.

A flat panel display includes a display panel which displays an image and a driving element which drives the display panel. Here, the driving element includes an integrated circuit (IC), a flexible printed circuit board (FPCB), etc., used to drive the display panel. The driving element contacts a pad region formed at the periphery of the display panel to provide a driving signal. The driving element may be electrically connected to the pad region by being mounted on a flexible film in the form of chip-on-film (COF), or being attached to the pad region in the form of chip-on-glass (COG).

Whether or not the driving element and the display panel have been connected normally can be identified by measuring the contact resistance of the driving element and the display panel.

To measure the contact resistance, a 4-terminal measurement method has been suggested. The 4-terminal method uses two terminals for providing a constant current to a contact resistor and two terminals for measuring voltages at both terminals of the contact resistor. In addition, measurement equipment for implementing the 4-terminal method is used.

SUMMARY

Aspects of example embodiments of the present invention relate to a drive integrated circuit package which can more easily measure the contact resistance of a driving element and a display panel.

Aspects of example embodiments of the present invention also relate to a display device including a drive integrated circuit package which can more easily measure the contact resistance of a driving element and a display panel.

However, the present invention is not restricted to the example embodiments set forth herein. The above and other aspects of the present invention will become more apparent to one of ordinary skill in the art to which the present invention pertains by referencing the detailed description of the present invention given below.

According to an embodiment of the present invention, there is provided a drive integrated circuit package including: bumps configured to be coupled to test pads on a display panel to form coupling portions; a drive integrated circuit including a constant current source configured to provide a constant current to each of the coupling portions; and a voltage measurer configured to measure a voltage difference between terminals of each of the coupling portions.

The voltage measurer may include: a differential amplifier configured to generate an output voltage by amplifying the voltage difference between the terminals of each of the coupling portions; and a measurement point at which the output voltage is measured.

The voltage measurer may further include a voltage comparator configured to compare the output voltage with a reference voltage, and to output a low-level voltage to the measurement point when the output voltage is higher than the reference voltage.

The differential amplifier and the measurement point may be on a printed circuit board configured to provide an external signal to the drive integrated circuit.

The differential amplifier may be coupled to the measurement point by a wiring line on the display panel.

The drive integrated circuit and the bumps may be on a base film or the display panel.

The bumps may include: a first bump coupled to a first terminal of the constant current source; a second bump coupled to a second terminal of the constant current source; and a third bump not electrically coupled to the first bump and the second bump, wherein the first through third bumps are configured to be coupled to first through third test pads to form first through third coupling portions, respectively.

The first through third test pads may be electrically coupled to each other, and the constant current provided by the constant current source flows through the first coupling portion and the second coupling portion.

The voltage measurer may be configured to measure a voltage difference between the terminals of the first coupling portion by measuring a first voltage at the first terminal of the constant current source and measuring a second voltage between the first test pad and the second test pad through the third coupling portion.

According to another embodiment of the present invention, there is provided a drive integrated circuit package including: first through third bumps respectively coupled to first through third test pads on a display panel; a drive integrated circuit including a constant current source having a first terminal coupled to the first bump and a second terminal coupled to the second bump; and a voltage measurer including a first input terminal coupled to the first terminal of the constant current source, and a second input terminal coupled to the third bump.

The voltage measurer may include: a differential amplifier configured to generate an output voltage by amplifying a voltage difference between a voltage input to the first input terminal and a voltage input to the second input terminal; and a measurement point at which the output voltage is measured.

The voltage measurer may further include a voltage comparator configured to compare the output voltage with a reference voltage, and to output a low-level voltage to the measurement point when the output voltage is higher than the reference voltage.

The first through third test pads may be electrically coupled to each other, and a constant current provided by the constant current source may flow through the first bump, the first test pad, the second test pad, and the second bump.

The voltage measurer may be configured to measure a voltage drop due to a coupling resistance of the first bump and the first test pad.

According to another embodiment of the present invention, there is provided a display device including: a display panel; a drive integrated circuit package configured to provide a driving signal to the display panel; and test pads on the display panel to correspond to the drive integrated circuit package, wherein the drive integrated circuit package includes: bumps configured to be electrically coupled to the test pads to form coupling portions; a drive integrated circuit including a constant current source configured to provide a constant current to each of the coupling portions; and a voltage measurer configured to measure a voltage difference between terminals of each of the coupling portions.

The voltage measurer may include: a differential amplifier configured to generate an output voltage by amplifying the voltage difference between the terminals of each of the coupling portions; and a measurement point at which the output voltage is measured.

The voltage measurer may further include a voltage comparator configured to compare the output voltage with a reference voltage, and to output a low-level voltage to the measurement point when the output voltage is higher than the reference voltage.

The drive integrated circuit package may be formed in a plurality along an edge of the display panel, and the voltage comparator of each of the drive integrated circuit packages may be configured to output a low-level voltage to one measurement point.

The bumps may include: a first bump coupled to a first terminal of the constant current source; a second bump coupled to a second terminal of the constant current source; and a third bump not electrically coupled to the first bump and the second bump, wherein the first through third bumps may be configured to be coupled to first through third test pads to form first through third coupling portions, respectively.

The first through third test pads may be electrically coupled to each other, the constant current provided by the constant current source may flow through the first coupling portion and the second coupling portion, and the voltage measurer may be configured to measure a voltage difference between the terminals of the first coupling portion by measuring a first voltage at the first terminal of the constant current source and measuring a second voltage between the first test pad and the second test pad through the third coupling portion.

BRIEF DESCRIPTION OF THE DRAWINGS

The above and other aspects and features of the present invention will become more apparent from the following description of the example embodiments with reference to the attached drawings, in which.

DETAILED DESCRIPTION

Figure 1:
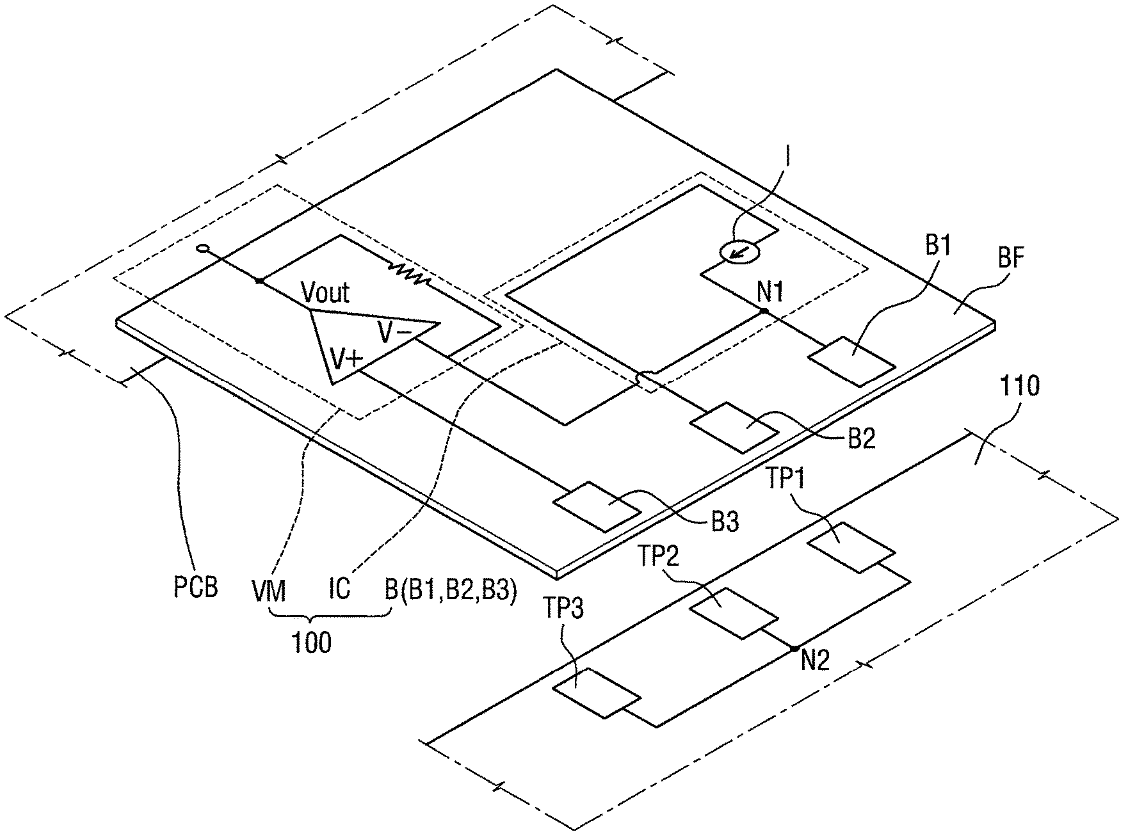
FIG. 1 is a schematic diagram of a drive integrated circuit package according to an embodiment of the present invention.

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in various forms. The embodiments described in the description, such as the detailed construction and elements, are nothing but specific details provided to assist those of ordinary skill in the art in a comprehensive understanding of the invention, and the present invention is only defined within the scope of the appended claims, and their equivalents.

The term "on" that is used to designate that an element is on another element or located on a layer or layers includes both a case where an element is located directly on another element or layer and a case where an element is located on another element or layer via one or more intervening elements or layers. When an element is described as "coupled" or "connected" to another element, the element may be "directly coupled" or "directly connected" to the other element, or "indirectly coupled" or "indirectly connected" to the other element through one or more other intervening elements. In the entire description of embodiments of the present invention, the same drawing reference numerals are used for the same elements across various figures.

Although the terms "first, second, and so forth" are used to describe diverse constituent elements, such constituent elements are not limited by these terms. These terms are used only to distinguish a constituent element from other constituent elements. Accordingly, in the following description, a first constituent element may be a second constituent element.

Hereinafter, embodiments of the present invention will be described with reference to the attached drawings.

Figure 2:
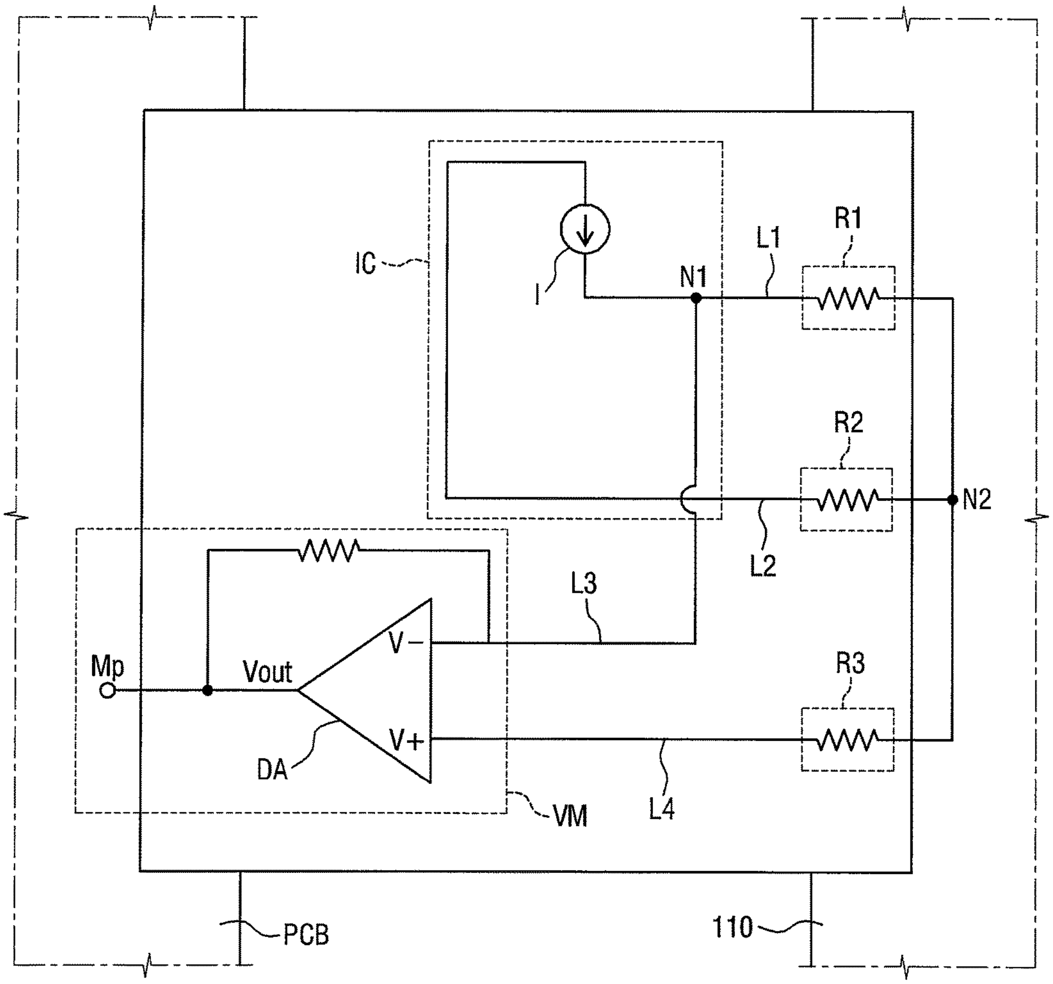
FIG. 2 is a circuit diagram of the drive integrated circuit package of FIG. 1.
Figure 3:
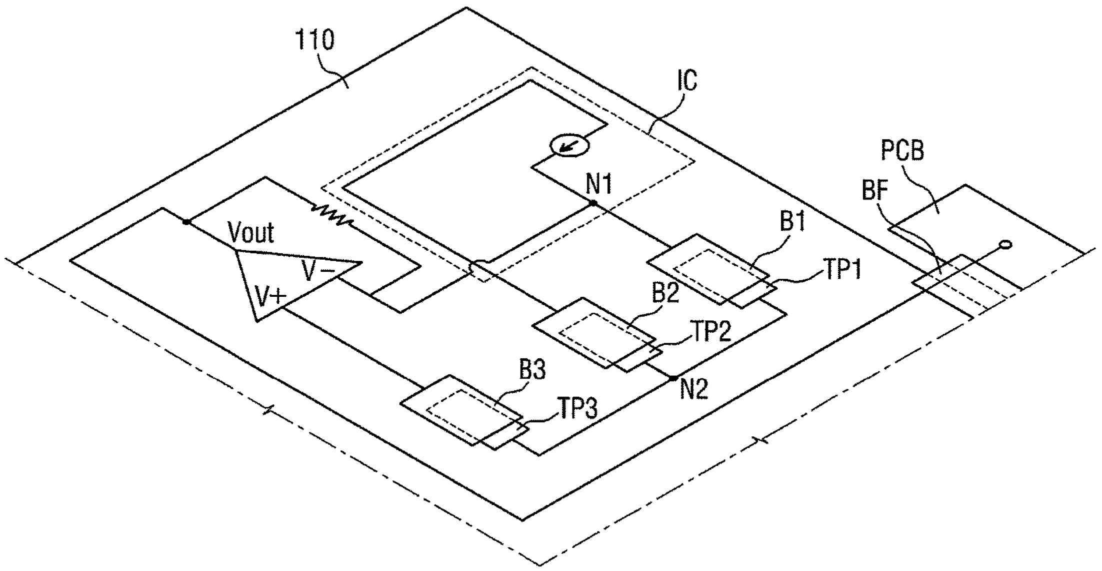
FIG. 3 is a schematic diagram of the drive integrated circuit package of FIG. 1 mounted on a display panel by chip-on-glass (COG)
Figure 4:
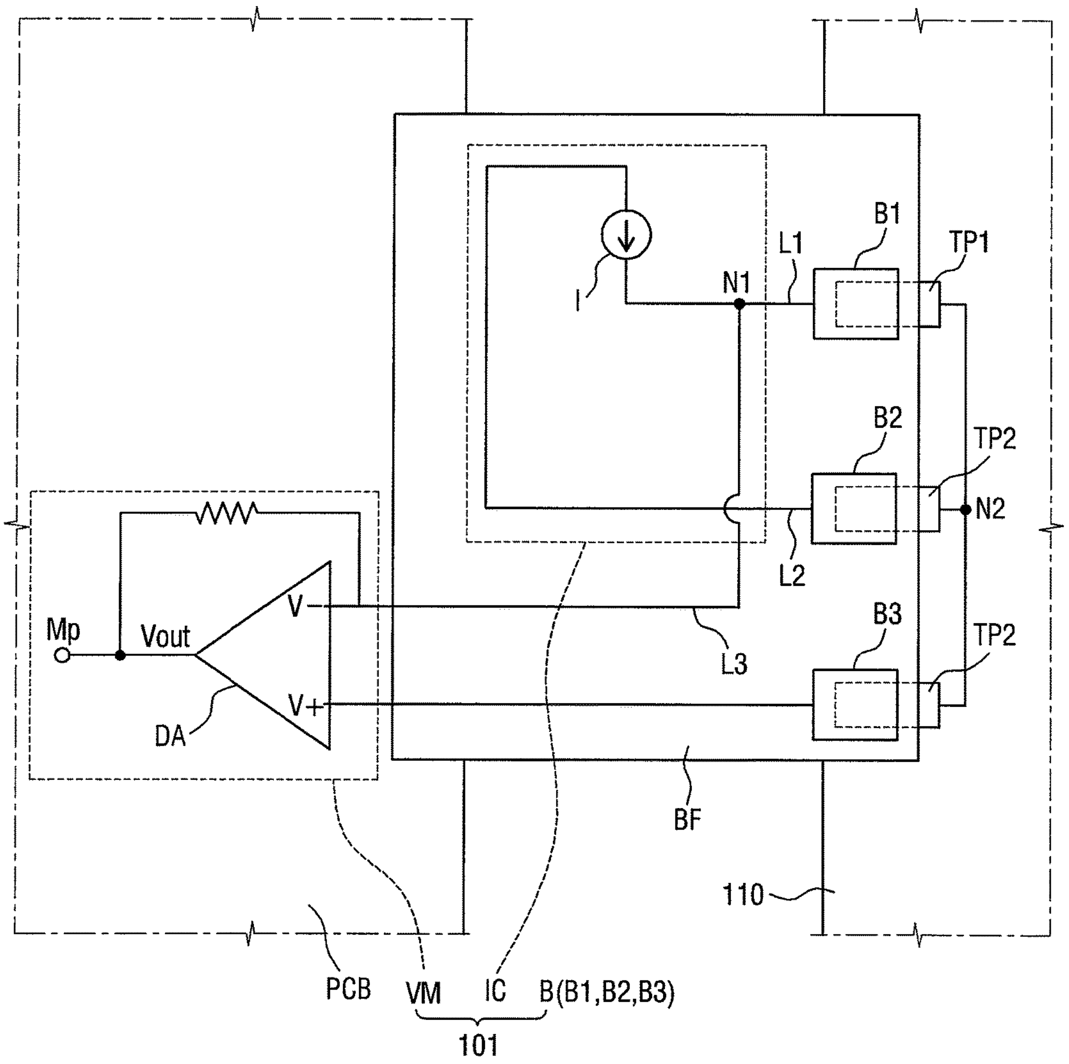
FIGS. 4 and 5 are circuit diagrams of drive integrated circuit packages according to other embodiments of the present invention.
Figure 5:
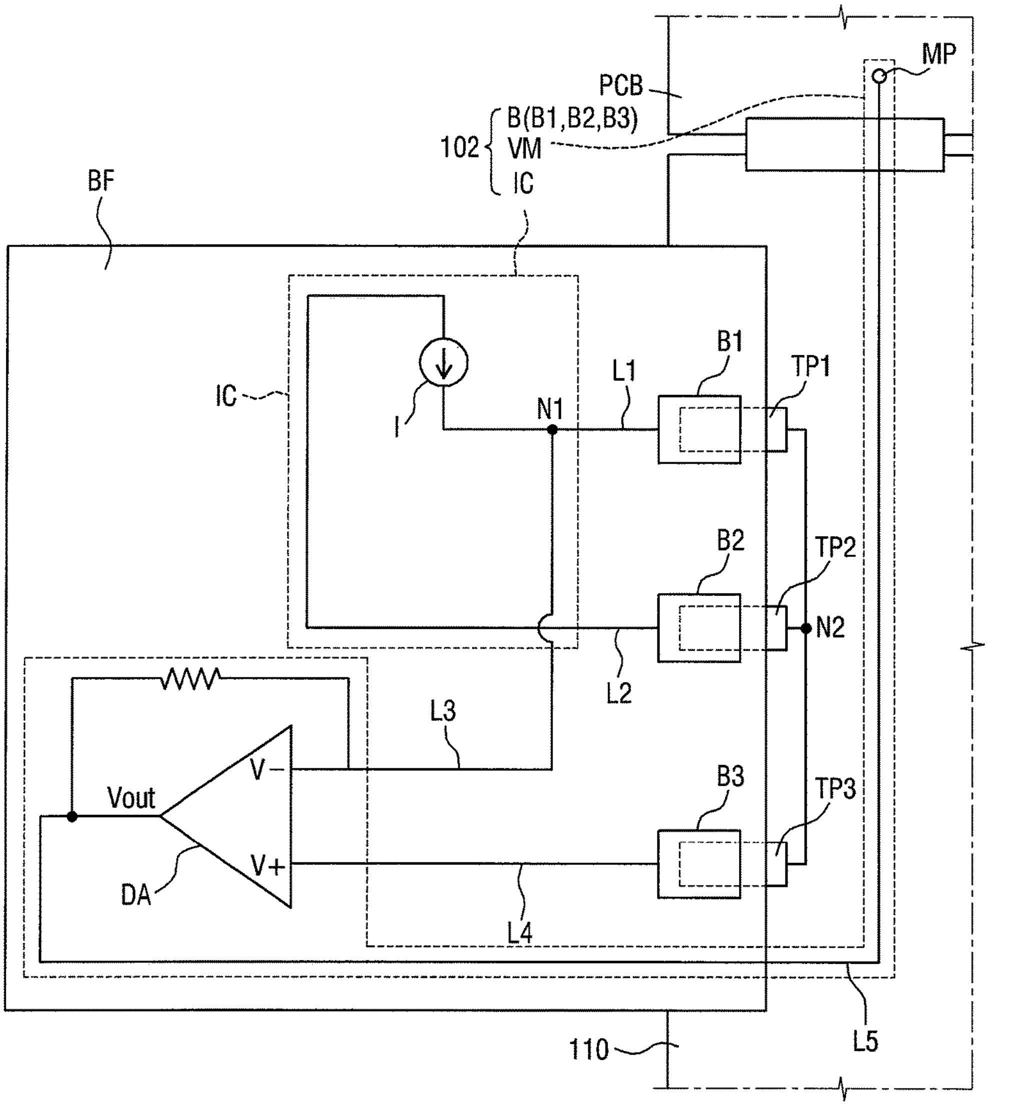

FIG. 1 is a schematic diagram of a drive integrated circuit package 100 according to an embodiment of the present invention. FIG. 2 is a circuit diagram of the drive integrated circuit package 100 of FIG. 1. FIG. 3 is a schematic diagram of the drive integrated circuit package 100 of FIG. 1 mounted on a display panel 110 by chip-on-glass (COG). FIGS. 4 and 5 are circuit diagrams of drive integrated circuit packages 101 and 102 according to other embodiments of the present invention.

Referring to FIGS. 1 through 5, the drive integrated circuit package 100 includes a drive integrated circuit IC, bumps B, and a voltage measurer VM.

The drive integrated circuit IC may be in the form of an integrated circuit chip. The drive integrated circuit IC may include a scan driver which generates a scan signal and a data driver which generates a data signal, in response to driving power and signals received from a printed circuit board PCB. The drive integrated circuit IC may provide a scan signal and a data signal respectively generated by the scan driver and the data driver to the display panel 110. The drive integrated circuit IC may be mounted on a base film BF by chip-on-film (COF) technology. The drive integrated circuit IC may contact the display panel 100 through a wiring line formed on the base film BF, and transmit a signal to the display panel 110. However, the present invention is not limited thereto, and the drive integrated circuit IC may also be formed in a pad region of the display panel 110 by COG technology as illustrated n FIG. 3.

The drive integrated circuit IC may include a constant current source I which provides a constant current. That is, the constant current source I may be embedded in the drive integrated circuit IC. The constant current source I may be connected to an external power source and may operate independently of the scan driver and the data driver. The constant current source I may provide a constant current in order to measure the contact resistance of the drive integrated circuit package 100 and the display panel 110. The constant current may be provided to the bumps B which are electrically coupled to test pads TP of the display panel 110.

Each of the bumps B may be made of a conductive material at an end of a wiring line extending from the drive integrated circuit IC. The bumps B may be shaped to be easily coupled to the test pads TP. The shape and structure of the bumps B are not limited to the example illustrated in FIG. 1. The bumps B may be electrically connected to the test pads TP formed on the display panel 110. The test pads TP may be test patterns formed to measure the coupling resistance of the display panel 110 and the drive integrated circuit package 100. The bumps B may be coupled to the test pads TP to form coupling portions R, respectively.

The voltage measurer VM may measure voltages formed at both terminals of each of the coupling portions R. That is, the voltage measurer VM may measure a voltage difference caused by each of the coupling portions R to determine whether the display panel 110 and the drive integrated circuit package 100 have been coupled normally to each other.

The test pads TP may be made of a conductive material and may include first through third test pads TP1 through TP3 electrically connected to each other. The bumps B may include first through third bumps B1 through B3 coupled to the first through third test pads TP1 through TP3, respectively. The first through third bumps B1 through B3 may be floating without being electrically connected to each other. However, the first through third bumps B1 through B3 can be electrically connected to each other by another component. The first bump B1, the second bump B2, and the third bump B3 may be electrically coupled to the first test pad TP1, the second test pad TP2, and the third test pad TP3 to form a first coupling portion R1, a second coupling portion R2, and a third coupling portion R3, respectively. Each of the first through third coupling portions R1 through R3 may have certain contact resistance. If the drive integrated circuit package 100 is not mounted on the display panel 110 normally, the contact resistance of each of the first through third coupling portions R1 through R3 may be higher than a general contact resistance (e.g., a normal contact resistance). The voltage measurer VM may measure voltages formed at both terminals of at least one of the first through third coupling portions R1 through R3, and may measure a voltage drop caused by the coupling portion. Here, the voltage measurer VM may measure voltages at both terminals of the first coupling portion R1 formed by the first bump B1 and the first test pad TP1. That is, the voltage measurer VM may measure a first voltage V1 of a first node N1. The voltage measurer VM may measure a second voltage V2 of a second node N2 which does not contact the first bump B1 and is connected to the first test pad TP1.

The first bump B1 may be connected to a first terminal of the constant current source I by a first wiring line L1, and the second bump B2 may be connected to a second terminal of the constant current source I by a second wiring line L2. That is, a constant current provided at the first terminal of the constant current source I may sequentially pass through the first bump B1, the first test pad TP1 electrically connected to the first bump B1, the second test pad TP2 electrically connected to the first test pad TP1, and the second bump B2 electrically coupled to the second test pad TP2 to flow to the second terminal of the constant current source I. That is, the first bump B1, the first test pad TP1, the second bump B2, and the second test pad TP2 may form a section through which a constant current can flow.

The voltage measurer VM may measure a voltage drop due to the first coupling portion R1 in the section.

The voltage measurer VM may include a differential amplifier DA and a measurement point Mp which can measure an output voltage Vout of the differential amplifier DA. The differential amplifier DA may include a first input terminal V− and a second input terminal V+. The first input terminal V− of the voltage measurer VM may be connected to the first node N1 by a third wiring line L3, and the second input terminal V+ of the voltage measurer VM may be connected to the third bump B3 by a fourth wiring line L4. That is, the second input terminal V+ may be electrically connected to the second node N2 by the third coupling portion R3 which is formed by the third bump B3 and the third test pad TP3 electrically coupled to each other. Here, since no electric current flows to the fourth wiring line L4 due to characteristics of the differential amplifier DA, a voltage drop due to the third coupling portion R3 may not occur. That is, a voltage drop due to an electric current does not occur at the first input terminal V− and the second input terminal V+ of the differential amplifier DA. Therefore, the first voltage V1 of the first node N1 and the second voltage V2 of the second node N2 may be input to the first input terminal V− and the second input terminal V+ of the differential amplifier DA, respectively. The differential amplifier DA may amplify a difference between voltages input to the first input terminal V− and the second input terminal V+ and output the amplified output voltage Vout to the measurement point Mp.

The output voltage Vout may be measured at the measurement point Mp. Since the measurement point Mp includes one terminal, a voltage can be easily measured using a general voltage multi-meter. The output voltage Vout measured at the measurement point Mp may be a voltage difference between the first input terminal V− and the second input terminal V+ as defined by Equation (1):

$$V\text{out} \propto (V+-V-) \qquad (1)$$

As described above, the output voltage Vout may be a voltage value obtained by amplifying a voltage drop due to the first coupling portion R1.

In the drive integrated circuit package 100 according to the described embodiment, the constant current source I which can provide a constant current to a coupling portion between the drive integrated circuit package 100 and the display panel 110 is mounted within the drive integrated circuit IC, and a component which can easily measure a potential difference caused by the coupling portion is provided. Therefore, the contact resistance between the driving element and the display panel 110 can be measured more easily than an existing measurement method.

In addition, the differential amplifier DA of the voltage measurer VM according to the present embodiment may be formed on the base film BF, and the measurement point Mp may be formed on the printed circuit board PCB. However, the present invention is not limited thereto, and the differential amplifier DA may also be embedded in the drive integrated circuit IC, together with the constant current source I.

Referring to FIG. 4, unlike in the drive integrated circuit package 100 according to the embodiment of FIG. 1, in the drive integrated circuit package 101 according to the embodiment of FIG. 4, a voltage measurer VM may be formed on a printed circuit board PCB. That is, both a differential amplifier DA and a measurement point Mp may be formed on the printed circuit board PCB. Therefore, the area of a base film BF for forming the voltage measurer VM can be reduced. If the present embodiment is applied to COG technology, the voltage measurer VM can be formed on the printed circuit board PCB. That is, the area of a pad region of a display panel 110 on which the drive integrated circuit package 101 is mounted can be reduced.

Referring to FIG. 5, the drive integrated circuit package 102 according to another embodiment of the present invention may be coupled to a side of a display panel 110 to which a printed circuit board PCB is not attached. That is, the display panel 110 may be a large-sized panel, and a drive integrated circuit IC of the drive integrated circuit package 102 may include a scan driver only. The drive integrated circuit IC may receive a driving signal from the printed circuit board PCB attached to another side of the display panel 110 through a wiring line formed on the display panel 110. A measurement point Mp may be formed on the printed circuit board PCB attached to the other side of the display panel 110. A differential amplifier DA may be connected to the measurement point Mp by a fifth wiring line L5 formed in the display panel 110. That is, if the drive integrated circuit package 102 is not physically connected to the printed circuit board PCB, the measurement point Mp may be formed on the printed circuit board PCB which is attached to the other side of the display panel 110 by a wiring line formed on the display panel 110.

Hereinafter, another embodiment of the present invention will be described.

Figure 6:
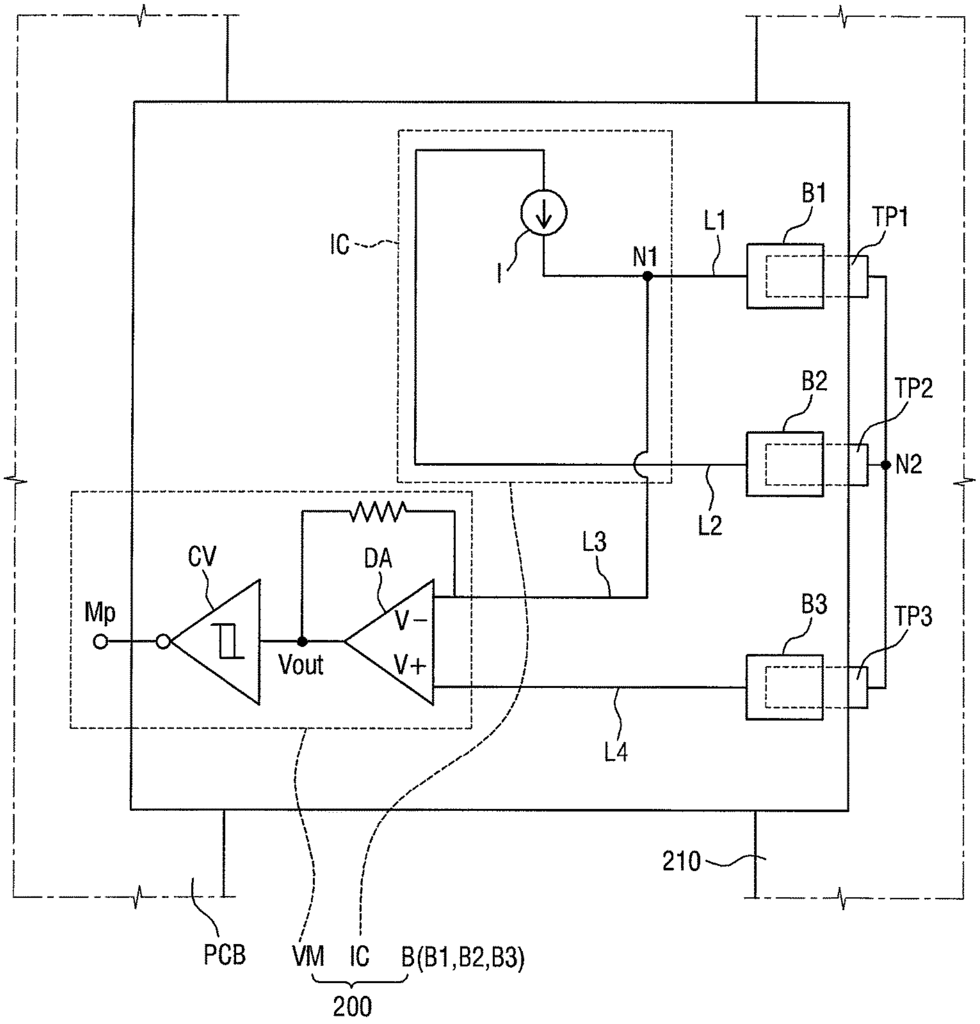
FIG. 6 is a circuit diagram of a drive integrated circuit package according to another embodiment of the present invention.

FIG. 6 is a circuit diagram of a drive integrated circuit package 200 according to another embodiment of the present invention.

Referring to FIG. 6, a voltage measurer VM of the drive integrated circuit package 200 according to another embodiment may further include a voltage comparator CV.

The voltage comparator CV may compare an output voltage Vout and a reference voltage Vref. When the output voltage Vout is higher than the reference voltage Vref, the voltage comparator CV may output a low-level voltage to a measurement point Mp. When the output voltage Vout is lower than the reference voltage Vref, the voltage comparator CV may output a high-level voltage to the measurement point Mp. The voltage comparator CV may be an inverting Schmitt trigger. If bumps B of the drive integrated circuit package 200 are not normally mounted on test pads TP of a display panel 210, the coupling resistance formed between each of the bumps B and a corresponding one of the test pads TP may be high. Therefore, the output voltage Vout may have a high level. That is, if the drive integrated circuit package 200 is not mounted normally on the display panel 210, the voltage comparator CV may output a low-level voltage. Here, the reference voltage Vref may be an experimentally determined voltage and may be lower than the output voltage Vout output when the driving element is not mounted normally on the display panel 210. The low-level voltage may be a voltage set to a specific low voltage value.

In an example embodiment, the low-level voltage may be a ground voltage corresponding to 0 V.

That is, the present embodiment can easily determine whether the drive integrated circuit package 200 and the display panel 210 have been coupled normally by detecting a low-level voltage.

Other components of the drive integrated circuit package 200 are substantially the same as those of the drive integrated circuit package 100 indicated by the same reference characters or names in FIGS. 1 through 3, and thus any repetitive detailed description thereof will be omitted.

A display device including any one of the above-described drive integrated circuit packages according to an embodiment of the present invention will now be described.

Figure 7:
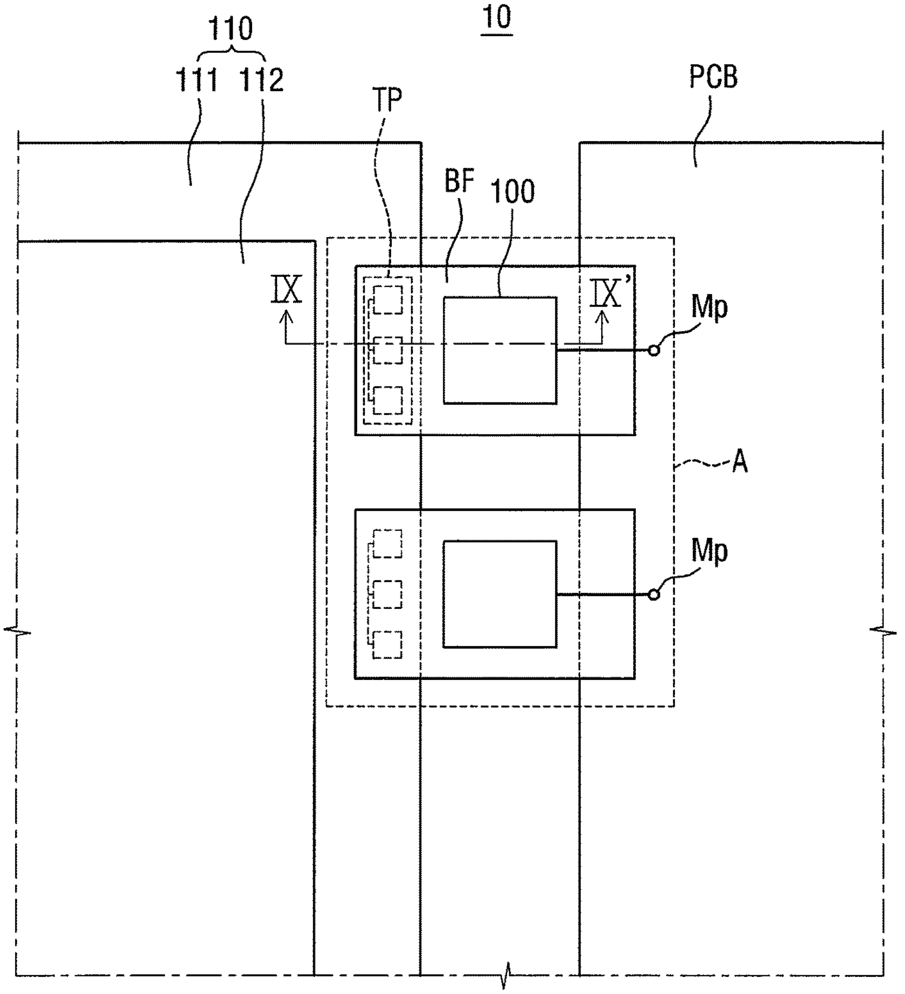
FIG. 7 is a schematic diagram of a display device according to an embodiment of the present invention.
Figure 8:
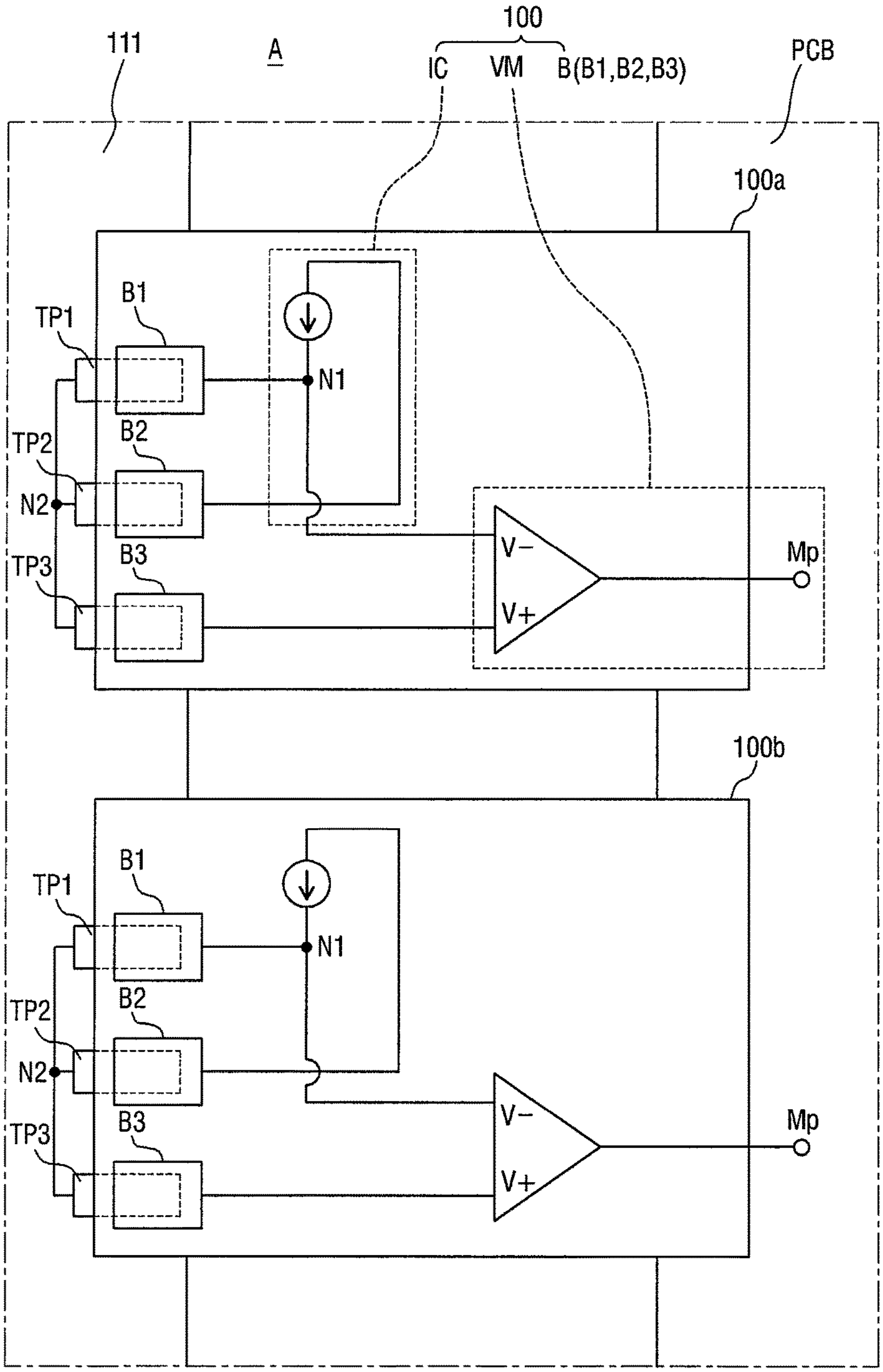
FIG. 8 is an enlarged view of a region 'A' of FIG. 7.

FIG. 7 is a schematic diagram of a display device 10 according to an embodiment of the present invention. FIG. 8 is an enlarged view of a region 'A' of FIG. 7.

Referring to FIGS. 7 and 8, the display device 10 may include a drive integrated circuit package 100, a display panel 110, and test pads TP.

The drive integrated circuit package 100 may be the drive integrated circuit package 100 shown in FIGS. 1 through 3. However, the present invention is not limited thereto, and the drive integrated circuit package 100 may also be the drive integrated circuit package 101 or 102 according to the embodiments of FIG. 4 or 5, or the drive integrated circuit package 200 according to the embodiment of FIG. 6. The drive integrated circuit package 100 may include a drive integrated circuit IC, bumps B, and a voltage measurer VM. The structure and operation of the drive integrated circuit package 100 are substantially the same as those of the above-described embodiments, and thus detailed description thereof will be omitted.

The display panel 110 may be a panel that displays an image. The display panel 110 may include a first substrate 111 and a second substrate 112. The first substrate 111 may be a base substrate on which display elements, thin-film transistors (TFTs), etc. needed to display an image are placed. The second substrate 112 may be disposed over the first substrate 111 to face the first substrate 111. The second substrate 112 may be an encapsulation substrate. That is, second substrate 112 may encapsulate the display elements, the TFTs, etc. of the first substrate 111, together with a sealant 128. In addition, a pad unit connected to the drive integrated circuit package 100 may be formed at a side of the first substrate 111. That is, the drive integrated circuit package 100 may be coupled to the pad unit of the first substrate 111, and may provide a driving signal to the first substrate 111 through the pad unit. The drive integrated circuit package 100 may be provided in a plurality, and the drive integrated circuit packages 100 may be placed along (e.g., along an edge of) the first substrate 111. The first substrate 111 may control the display elements by driving the TFTs using driving signals received from the drive integrated circuit packages 100. The first substrate 111 may include the test pads TP used to determine whether the drive integrated circuit packages 100 have been mounted normally on the first substrate 111. That is, the pad unit of the first substrate 110 on which the drive integrated circuit packages 100 are mounted may include the test pads TP.

The test pads TP may correspond to the drive integrated circuit packages 100. That is, a group of the test pads TP may be formed in a pad region to correspond to each of the drive integrated circuit packages 100 in order to determine whether each of the drive integrated circuit packages 100 has been mounted normally on the first substrate 111. In other words, the test pads TP may be formed in a plurality of groups, and the groups of the test pads TP may be formed along the edge of the first substrate 111. The test pads TP may be coupled to the bumps B of the drive integrated circuit package 100, thereby forming coupling portions R. Each of the drive integrated circuit packages 100 may include the voltage measurer VM which measures a voltage difference between both terminals of each coupling portion R, and determines whether the integrated circuit package 100 has been mounted normally on the first substrate 111. The voltage measurer VM of each drive integrated circuit package 100 may include a measurement point Mp which can measure the voltage difference between both terminals of each coupling portion R. Each measurement point Mp may be formed on a printed circuit board PCB. That is, whether each drive integrated circuit package 100 has been mounted normally on the first substrate 111 can be easily determined by measuring a voltage at a corresponding measurement point Mp.

Figure 9:
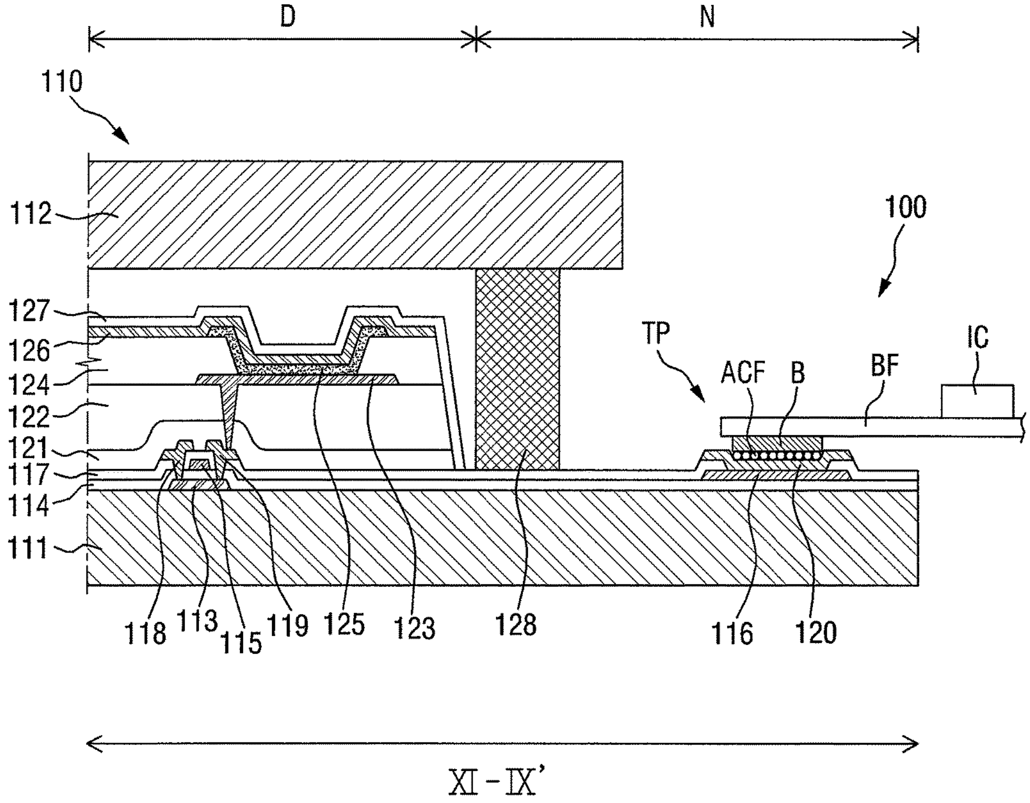
FIG. 9 is a cross-sectional view taken along the line IX-IX' of FIG. 7.

The structure of the display panel 110 will now be described in greater detail. FIG. 9 is a cross-sectional view taken along the line IX-IX' of FIG. 7.

Referring to FIG. 9, the display panel 110 may include a test pad TP, the first substrate 111, the second substrate 112, a semiconductor pattern 113, a gate insulating layer 114, a gate electrode 115, an interlayer insulating film 117, a source electrode 118, a drain electrode 119, an intermediate layer 121, a planarization layer 122, a first electrode 123, a pixel defining layer 124, an organic light-emitting layer 125, a second electrode 126, a passivation layer 127, and the sealant 128. Here, the test pad TP may include a pad terminal 116 and an auxiliary terminal 120.

The first substrate 111 may include a polymer with high thermal resistance. In an example embodiment, the first substrate 111 may include any one material selected from the group including polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate, cellulose acetate propionate (CAP), poly(aryleneether sulfone), or various combinations thereof. The first substrate 111 may have flexibility. That is, the first substrate 111 may be a deformable substrate that can be rolled, folded, bent, etc.

The first substrate 111 may include a display area D and a non-display area N. The display area D may be an area where an image is displayed. In addition, the display area D may be an area where display elements for actually displaying an image and TFTs electrically connected to the display elements are located. Here, the display elements may be, but are not limited to, organic light-emitting elements. The non-display area N may be an area where no image is displayed. In addition, the non-display area N may be a pad region in which the sealant 128 and the test pad TP may be located. In addition, the non-display area N may be adjacent to edges of the first substrate 111. That is, the non-display area N may be located in an edge portion of the first substrate 111.

The non-display area N may surround the display area D. Although not illustrated in the drawing, a buffer layer may be located on the first substrate 111. The buffer layer may prevent or substantially prevent the diffusion of metallic atoms, impurities, etc. from the first substrate 111. If the surface of the first substrate 111 is not even, the buffer layer may improve the flatness of the surface of the first substrate 111.

The semiconductor pattern 113 may be formed on the first substrate 111. For example, the semiconductor pattern 113 may be located at the display area D of the first substrate 111. If the buffer layer is formed on the first substrate 111, the semiconductor pattern 113 may be formed on the buffer layer. The semiconductor pattern 113 may be made of amorphous semiconductor, microcrystalline semiconductor, or polycrystalline semiconductor. In an example embodiment, the semiconductor pattern 113 may be made of polycrystalline semiconductor. The semiconductor pattern 113 may also be made of oxide semiconductor. The semiconductor pattern 113 may include a channel portion that is not doped with impurities, and p+-doped source and drain portions which are disposed on both sides of the channel portion. Here, an ion material used to dope the source and drain portions may be P-type impurities such as boron (B). For example, $B_2H_6$ may be used. However, the present invention is not limited thereto, and the impurities may vary according to the type of a TFT.

The gate insulating layer 114 may be formed on the buffer layer to cover the semiconductor pattern 113. The gate insulating layer 114 may be located at the display area D and the non-display area N of the first substrate 111. The gate insulating layer 114 may be made of silicon oxide (SiOx), silicon nitride (SiNx), or metal oxide.

The gate electrode 115 may be formed on the gate insulating layer 114. The gate electrode 115 may be located at the display area D of the first substrate 111. The gate electrode 115 may be formed on a portion of the gate insulating layer 114 under which the semiconductor pattern 113 is located. The gate electrode 115 may include a metal, an alloy, metal nitride, conductive metal oxide, a transparent conductive material, etc. In addition, the gate electrode 115 and the channel portion may overlap each other. However, the dimensions of the gate electrode 115 and/or the dimensions of the channel portion may vary according to the electrical characteristics required of a switching element including the gate electrode 115 and the channel portion.

The pad terminal 116 may be formed on the gate insulating layer 114. The pad terminal 116 may be located at the non-display area N of the first substrate 111. The pad terminal 116 may include a metal, an alloy, metal nitride, conductive metal oxide, a transparent conductive material, etc. In addition, the pad terminal 116 may be made of the same or substantially the same material as that of the gate electrode 115. The pad terminal 116 may be formed at the same time as the gate electrode 115.

The interlayer insulating film 117 may be formed on the gate insulating layer 114 to cover the gate electrode 115 and the pad terminal 116. The interlayer insulating film 117 may be formed at the display area D and the non-display area N of the first substrate 111. The interlayer insulating film 117 may be formed on the gate insulating layer 114 to a substantially uniform thickness along the profile of the gate electrode 115 and the pad terminal 116. Therefore, the interlayer insulating film 117 may have steps formed adjacent to the gate electrode 115 and to the pad terminal 116. The interlayer insulating film 117 may be made of a silicon compound. The interlayer insulating film 117 may insulate the gate electrode 115 from the source electrode 118 and the drain electrode 119 which may be formed later.

The interlayer insulating film 117 may include a first contact hole which partially exposes the semiconductor pattern 113, and a second contact hole which partially exposes the pad terminal 116. The first contact hole may be formed at the display area D of the first substrate 111. In an example embodiment, the first contact hole may expose the source portion and the drain portion of the semiconductor pattern 113. If the gate insulating layer 114 is located on the semiconductor pattern 113 as in the example embodiment of FIG. 9, the first contact hole may penetrate through the gate insulating layer 114. The first contact hole may extend in a direction perpendicular to a surface of the first substrate 111. The second contact hole may be formed at the non-display area N of the first substrate 111. In an example embodiment, the second contact hole may expose a central portion of the pad terminal 116. The second contact hole may extend in the direction perpendicular to the surface of the first substrate 111.

The source electrode 118 and the drain electrode 119 may be formed on the interlayer insulating film 117. For example, the source electrode 118 and the drain electrode 119 may be inserted into the first contact hole. That is, the source electrode 118 and the drain electrode 119 may be formed at the display area D of the first substrate 111. The source electrode 118 and the drain electrode 119 may be separated by a distance (e.g., predetermined distance) with respect to the gate electrode 115, and may be disposed adjacent to the gate electrode 115. For example, the source electrode 118 and the drain electrode 119 may penetrate through the interlayer insulating film 117 and the gate insulating layer 114 so as to contact the source portion and the drain portion of the semiconductor pattern 113, respectively. Each of the source electrode 118 and the drain electrode 119 may include a metal, an alloy, metal nitride, conductive metal oxide, a transparent conductive material, etc.

The formation of the source electrode 118 and the drain electrode 119 on the interlayer insulating film 117 may produce a TFT, which includes the semiconductor pattern 113, the gate insulating layer 114, the gate electrode 115, the source electrode 118, and the drain electrode 119, on the first substrate 111. The TFT may be a switching element of an organic light-emitting diode (OLED) display. Here, the TFT may be a top gate TFT, but the present invention is not limited thereto.

The auxiliary terminal 120 may be formed on the interlayer insulating film 117. For example, the auxiliary terminal 120 may be inserted into the second contact hole. That is, the auxiliary terminal 120 may be formed at the non-display area N of the first substrate 111. One pad terminal 116 and one auxiliary terminal 120 may form one test pad TP. The test pad TP may be coupled to a bump B of the drive integrated circuit package 100. The bump B and the test pad TP may be coupled by an anisotropic conducting film (ACF), and may form a coupling portion.

The intermediate layer 121 may be formed on the source electrode 118 and the drain electrode 119. That is, the intermediate layer 121 may be formed on the interlayer insulating film 117 to cover the source electrode 118 and the drain electrode 119. The intermediate layer 121 may be formed at the display area D of the first substrate 111. The intermediate layer 121 may be formed thick enough to completely cover the source electrode 118 and the drain electrode 119. The intermediate layer 121 may be made of an organic material or an inorganic material.

The planarization layer 122 may be formed on the intermediate layer 121. The planarization layer 122 may be formed at the display area D of the first substrate 111. The planarization layer 122 may have a flat surface. That is, the planarization layer 122 may be formed thick enough to have a flat surface on which pixels are to be located. The planarization layer 122 may be made of an insulating material.

The planarization layer 122 may include a via hole which partially exposes the drain electrode 119. In an example embodiment, the via hole may expose a central portion of the drain electrode 119. The via hole may extend in the direction perpendicular to the surface of the first substrate 111.

The first electrode 123 may be located on the planarization layer 122. The first electrode 123 may be formed at the display area D of the first substrate 111. The first electrode 123 may be inserted into the via hole so as to be electrically connected to the drain electrode 119. The first electrode 123 may be an anode or a cathode. If the first electrode 123 is an anode, the second electrode 126 may be a cathode. Thus, embodiments of the present invention will be described below based on this assumption. However, the first electrode 123 may also be a cathode, in which case the second electrode 126 may also be an anode.

To be used as an anode, the first electrode 123 may be made of a conductive material with a high work function. If the display device 10 is of a bottom emission type, the first electrode 123 may be made of a material such as ITO, IZO, ZnO or $In_2O_3$, or may be formed of a stacked layer of these materials. If the display device 10 is of a top emission type, the first electrode 123 may further include a reflective layer formed of Ag, Mg, Al, Pt, Pd, Au, Ni, Nd, Ir, Cr, Li, or Ca. The first electrode 123 can be modified in various ways to have, for example, a structure composed of two or more layers formed using two or more different materials selected from the above materials.

The pixel defining layer 124 may be formed on the first electrode 123. In addition, the pixel defining layer 124 may be formed at the display area D of the first substrate 111. The pixel defining layer 124 may partially expose the first electrode 123. The pixel defining layer 124 may be made of at least one organic material selected from benzocyclobutene (BCB), polyimide (PI), polyamaide (PA), acrylic resin, or phenolic resin, or may be made of an inorganic material such as silicon nitride. The pixel defining layer 124 may also be made of a photosensitizer that contains a black pigment. In this case, the pixel defining layer 124 may serve as a light-blocking member.

The organic light-emitting layer 125 may be formed on the first electrode 123. The organic light-emitting layer 125 may be formed at the display area D of the first substrate 111. In response to an electric current supplied to the organic light-emitting layer 125, electrons and holes within the organic light-emitting layer 125 may recombine to form excitons, and energy from the excitons may generate light of a certain wavelength.

The organic light-emitting layer 125 may be made of a small molecular weight organic material or a polymer organic material. The organic light-emitting layer 125 may include a hole-injection layer (HIL), a hole-transporting layer (HTL), a hole-blocking layer (HBL), an emitting layer (EML), an electron-transporting layer (ETL), an electron-injection layer (EIL), and an electron-blocking layer (EBL).

The second electrode 126 may be formed on the organic light-emitting layer 125. The second electrode 126 may be formed at the display area D of the first substrate 111. To be used as a cathode, the second electrode 126 may be made of a conductive material with a low work function. In an example embodiment, the second electrode 126 may be formed of Ag, Mg, Al, Pt, Pd, Au, Ni, Nd, Ir, Cr, Li, or Ca.

The formation of the second electrode 126 on the organic light-emitting layer 125 may produce an organic light-emitting element, which includes the first electrode 123, the organic light-emitting layer 125, and the second electrode

126, at the display area D of the substrate 111 as a display element of the display device 10.

The passivation layer 127 may be formed on the second electrode 126. The passivation layer 127 may be formed at the display area D of the first substrate 111.

The passivation layer 127 may protect display elements from external moisture or oxygen, thereby preventing or reducing the degradation of the display elements.

The passivation layer 127 may be an organic layer, an inorganic layer, or a multilayer composed of the organic layer and the inorganic layer. The passivation layer 127 may be formed by evaporation, chemical vapor deposition (CVD) or sputtering.

The second substrate 112 may be located on the passivation layer 127. The second substrate 112 may be separated from the passivation layer 127 by a distance (e.g., a predetermined distance). A space between the second substrate 112 and the passivation layer 127 may be filled with nitrogen. The second substrate 112 may face the first substrate 111. The second substrate 112 may be placed to cover the entirety of the display area D of the first substrate 111 and a part of the non-display area N. The second substrate 112 may encapsulate the display elements, the TFTs, etc. together with the sealant 128.

The second substrate 112 may be transparent plastic. However, the material that forms the second substrate 112 is not limited to transparent plastic, and the second substrate 112 can be made of various materials that can block external substances. In an example embodiment, the second substrate 112 may be made of the same material or substantially the same material as the first substrate 111.

The sealant 128 may be located on the edge portion of the first substrate 111 and the second substrate 112. In an example embodiment, the sealant 128 may be located at the non-display area N of the first substrate 111. The sealant 128 may contact the interlayer insulating film 117 located on the first substrate 111. However, the present invention is not limited thereto, and the sealant 128 may also contact the gate insulating layer 114 or the first substrate 111. In the example embodiment of FIG. 9, the sealant 128 may contact the interlayer insulating film 117 and the second substrate 112, to encapsulate the display elements, the TFTs, etc.

A display device according to another embodiment of the present invention will now be described.

Figure 10:
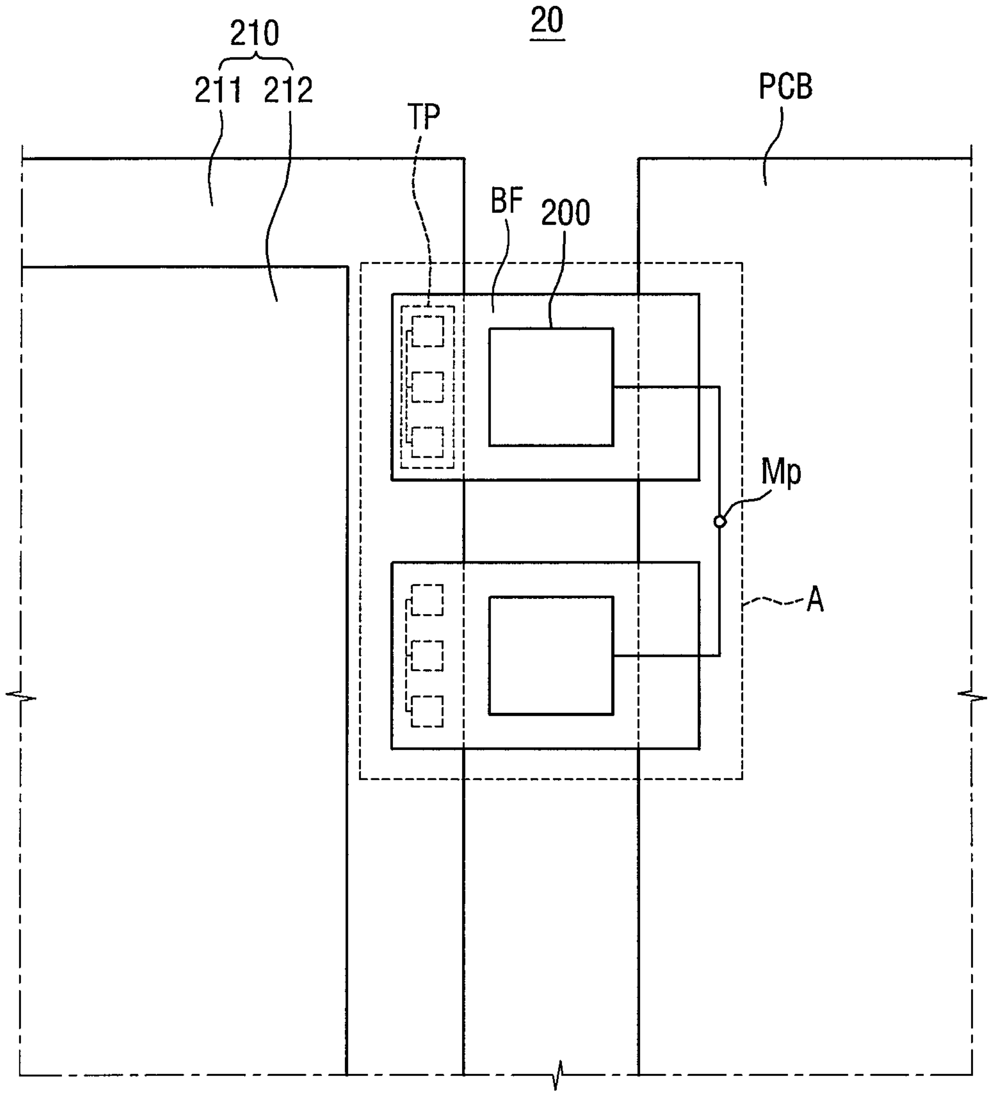
FIG. 10 is a schematic diagram of a display device according to another embodiment of the present invention.
Figure 11:
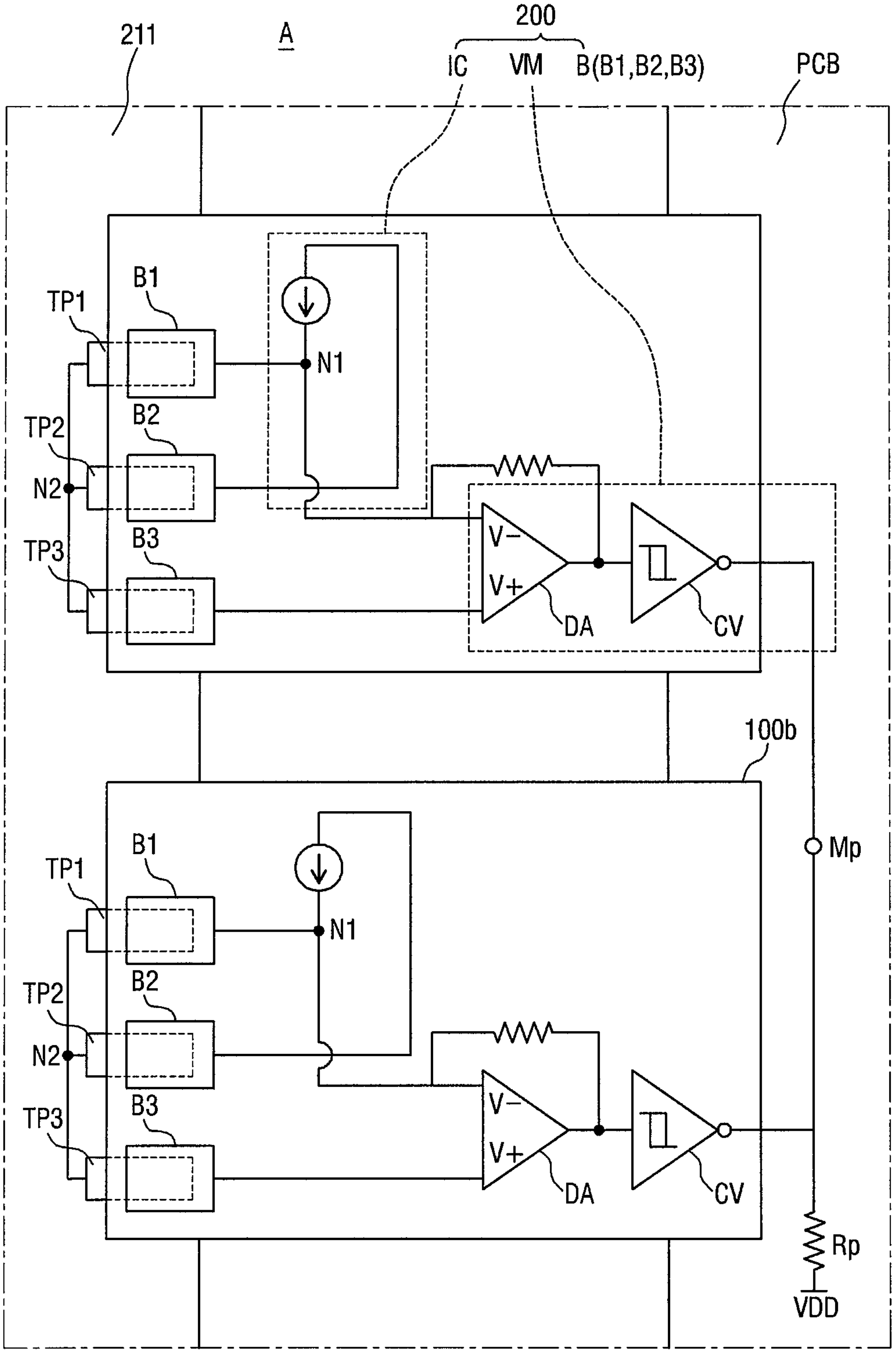
FIG. 11 is an enlarged view of a region 'A' of FIG. 10.

FIG. 10 is a schematic diagram of a display device 20 according to another embodiment of the present invention. FIG. 11 is an enlarged view of a region 'A' of FIG. 10.

Referring to FIGS. 10 and 11, the display device 20 may include a display panel 210, a plurality of drive integrated circuit packages 200 formed along an edge of the display panel 210, and groups of test pads TP corresponding to the drive integrated circuit packages 200.

A voltage measurer VM of each drive integrated circuit package 200 according to the present embodiment may include a voltage comparator CV. The voltage comparator CV may compare a reference voltage Vref with an output voltage Vout output from a differential amplifier DA of the voltage measurer VM. When the output voltage Vout is higher than the reference voltage Vref, the voltage comparator CV may output a low-level voltage to a measurement point Mp. When the output voltage Vout is lower than the reference voltage Vref, the voltage comparator CV may output a high-level voltage to the measurement point Mp. The voltage comparator CV may be an inverting Schmitt trigger. Here, the reference voltage Vref may be an experimentally determined voltage, and may be lower than the output voltage Vout output when the driving element is not mounted normally on the display panel 210. The low-level voltage may be a voltage having a specific low voltage value. In an example embodiment, the low-level voltage may be a ground voltage corresponding to 0 V. Each of the voltage comparators CV included in each drive integrated circuit packages 200 may output a low-level voltage or a high-level voltage to one measurement point Mp.

That is, an output voltage of the voltage comparator CV included in each of the drive integrated circuit packages 200 may be applied to the measurement point Mp according to the present embodiment. Here, when at least one of the drive integrated circuit packages 200 outputs a low-level voltage corresponding to 0 V, 0 V may be measured at the measurement point Mp. In addition, the measurement point Mp may be connected to a pull-up resistor Rp. When all of the drive integrated circuit packages 200 output high-level voltages, a certain voltage may be measured due to the pull-up resistor Rp. That is, if a certain voltage is measured at the measurement point Mp, it can be understood that the drive integrated circuit packages 200 connected to the measurement point Mp have been mounted normally on the display panel 210. If 0 V is measured at the measurement point Mp, it can be understood that any one of the drive integrated circuit packages 200 has been mounted abnormally. That is, whether the drive integrated circuit packages 200 have been mounted normally on the display panel 210 can be determined concurrently (e.g., simultaneously) by measuring one measurement point Mp.

Other components of the display device 20 are substantially the same as those of the display device 10 indicated by the same reference characters or names in FIGS. 7 through 9, and thus any repetitive detailed description thereof will be omitted.

Embodiments of the present invention provide at least one of the following features.

The contact resistance of a driving element and a display panel can be measured more easily.

However, the aspects of the present invention are not restricted to the one set forth herein. The above and other aspects of the present invention will become more apparent to one of ordinary skill in the art to which the present invention pertains by referencing the claims, and their equivalents.

While the present invention has been particularly shown and described with reference to example embodiments thereof, it will be understood by those of ordinary skill in the art that various changes in form and detail may be made therein without departing from the spirit and scope of the present invention as defined by the following claims, and their equivalents. The example embodiments should be considered in a descriptive sense only and not for purposes of limitation.

What is claimed is:

1. A drive integrated circuit package comprising:

bumps configured to be coupled to test pads on a display panel to form coupling portions;

a drive integrated circuit comprising a constant current source configured to provide a constant current to each of the coupling portions; and a voltage measurer configured to measure a voltage difference between terminals of each of the coupling portions, the voltage measurer comprising a differential amplifier configured to amplify the voltage difference between the terminals of each of the coupling portions and to output the amplified voltage difference as an output voltage utilized to determine whether each of the coupling portions have been coupled normally.

2. The circuit package of claim 1, wherein the voltage measurer comprises a measurement point at which the output voltage is measured.

3. The circuit package of claim 2, wherein the voltage measurer further comprises a voltage comparator configured to compare the output voltage with a reference voltage, and to output a low-level voltage to the measurement point when the output voltage is higher than the reference voltage.

4. The circuit package of claim 2, wherein the differential amplifier and the measurement point are on a printed circuit board configured to provide an external signal to the drive integrated circuit.

5. The circuit package of claim 2, wherein the differential amplifier is coupled to the measurement point by a wiring line on the display panel.

6. The circuit package of claim 1, wherein the drive integrated circuit and the bumps are on a base film or the display panel.

7. The circuit package of claim 1, wherein the bumps comprise:

a first bump coupled to a first terminal of the constant current source;

a second bump coupled to a second terminal of the constant current source; and a third bump not electrically coupled to the first bump and the second bump, wherein the first through third bumps are configured to be coupled to first through third test pads to form first through third coupling portions, respectively.

8. The circuit package of claim 7, wherein the first through third test pads are electrically coupled to each other, and the constant current provided by the constant current source flows through the first coupling portion and the second coupling portion.

9. The circuit package of claim 8, wherein the voltage measurer is configured to measure a voltage difference between the terminals of the first coupling portion by measuring a first voltage at the first terminal of the constant current source and measuring a second voltage between the first test pad and the second test pad through the third coupling portion.

10. A drive integrated circuit package comprising:

first through third bumps respectively coupled to first through third test pads on a display panel;

a drive integrated circuit comprising a constant current source having a first terminal coupled to the first bump and a second terminal coupled to the second bump; and a voltage measurer comprising a first input terminal coupled to the first terminal of the constant current source, and a second input terminal coupled to the third bump, the voltage measurer comprising a differential amplifier configured to measure and amplify a voltage difference between the first input terminal and the second input terminal and to output the amplified voltage difference as an output voltage utilized to determine whether each of the coupling portions have been coupled normally.

11. The circuit package of claim 10, wherein the voltage measurer comprises a measurement point at which the output voltage is measured.

12. The circuit package of claim 11, wherein the voltage measurer further comprises a voltage comparator configured to compare the output voltage with a reference voltage, and to output a low-level voltage to the measurement point when the output voltage is higher than the reference voltage.

13. The circuit package of claim 10, wherein the first through third test pads are electrically coupled to each other, and a constant current provided by the constant current source flows through the first bump, the first test pad, the second test pad, and the second bump.

14. The circuit package of claim 13, wherein the voltage measurer is configured to measure a voltage drop due to a coupling resistance of the first bump and the first test pad.

15. A display device comprising:

a display panel;

a drive integrated circuit package configured to provide a driving signal to the display panel; and test pads on the display panel to correspond to the drive integrated circuit package, wherein the drive integrated circuit package comprises:

bumps configured to be electrically coupled to the test pads to form coupling portions;

a drive integrated circuit comprising a constant current source configured to provide a constant current to each of the coupling portions; and a voltage measurer configured to measure a voltage difference between terminals of each of the coupling portions, the voltage measurer comprising a differential amplifier configured to amplify the voltage difference between the terminals of each of the coupling portions and to output the amplified voltage difference as an output voltage utilized to determine whether each of the coupling portions have been coupled normally.

16. The display device of claim 15, wherein the voltage measurer comprises a measurement point at which the output voltage is measured.

17. The display device of claim 16, wherein the voltage measurer further comprises a voltage comparator configured to compare the output voltage with a reference voltage, and to output a low-level voltage to the measurement point when the output voltage is higher than the reference voltage.

18. The display device of claim 17, wherein the drive integrated circuit package is formed in a plurality along an edge of the display panel, and the voltage comparator of each of the drive integrated circuit packages is configured to output a low-level voltage to one measurement point.

19. The display device of claim 15, wherein the bumps comprise:

a first bump coupled to a first terminal of the constant current source;

a second bump coupled to a second terminal of the constant current source; and a third bump not electrically coupled to the first bump and the second bump, wherein the first through third bumps are configured to be coupled to first through third test pads to form first through third coupling portions, respectively.

20. The display device of claim 19, wherein the first through third test pads are electrically coupled to each other, the constant current provided by the constant current source flows through the first coupling portion and the second coupling portion, and the voltage measurer is configured to measure a voltage difference between the terminals of the first coupling portion by measuring a first voltage at the first terminal of the constant current source and measuring a second voltage between the first test pad and the second test pad through the third coupling portion.

* * * * *